(12) United States Patent
Gwehenberger et al.

(10) Patent No.: US 12,024,769 B2
(45) Date of Patent: Jul. 2, 2024

(54) MOVABLE WORK PIECE CARRIER DEVICE FOR HOLDING WORK PIECES TO BE TREATED

(71) Applicant: Oerlikon Surface Solutions AG, Pfäffikon, Pfäffikon (CH)

(72) Inventors: Jürgen Gwehenberger, Sevelen (CH); Siegfried Krassnitzer, Feldkirch (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 175 days.

(21) Appl. No.: 17/609,470

(22) PCT Filed: May 7, 2020

(86) PCT No.: PCT/EP2020/062768
§ 371 (c)(1),
(2) Date: Nov. 8, 2021

(87) PCT Pub. No.: WO2020/225385
PCT Pub. Date: Nov. 12, 2020

(65) Prior Publication Data
US 2022/0235451 A1 Jul. 28, 2022

(30) Foreign Application Priority Data
May 7, 2019 (DE) ...................... 10 2019 111 777.1

(51) Int. Cl.
*C23C 14/50* (2006.01)
*C23C 14/32* (2006.01)
(Continued)

(52) U.S. Cl.
CPC .......... *C23C 14/505* (2013.01); *C23C 14/325* (2013.01); *C23C 14/35* (2013.01); *H01L 21/68764* (2013.01); *H01L 21/68771* (2013.01)

(58) Field of Classification Search
CPC ............. C23C 14/505; H01L 21/68764; H01L 21/68771; H01L 21/6719; H01L 21/67011; H01J 37/32715; H01J 37/3488
(Continued)

(56) References Cited

U.S. PATENT DOCUMENTS 4,582,431 A 4/1986 Cole
5,380,420 A * 1/1995 Tsuji ................... H01L 21/6723
204/298.23
(Continued)

FOREIGN PATENT DOCUMENTS

DE 2612098 9/1977
DE 69524640 12/2001
(Continued)

OTHER PUBLICATIONS

Examination Report Under Sections 12 & 13 of the Patents Act, 1970 and the Patents Rules, 2003 From the Government of India, Intellectual Property India, Patents, Designs, Trade Marks, Geographical Indications, The Patent Office Re. Applicaiton No. 202147051690. (7 Pages).
(Continued)

*Primary Examiner* — Rodney G McDonald (57) ABSTRACT

Work piece carrier device to be installed in a vacuum chamber of a vacuum treatment system, comprising:
one carousel X with a diameter $d_X$,
one or multiple carousels $Y_m$ with a diameter $d_{Ym} < d_X$, which are mountable on carousel X
one or multiple work piece supports $Z_n$ with diameters $d_{Zn} \leq d_{Ym}$, which are mountable on the one or multiple carousels $Y_m$,
two actuators A1 and A2.

18 Claims, 5 Drawing Sheets

(51) Int. Cl.
  *C23C 14/35* (2006.01)
  *H01L 21/687* (2006.01)
(58) Field of Classification Search
  USPC .................. 204/298.26, 298.27; 118/730
  See application file for complete search history.

(56) References Cited

U.S. PATENT DOCUMENTS

| | | | | |
|---|---|---|---|---|
| 5,468,299 | A | 11/1995 | Tsai | |
| 7,153,399 | B2* | 12/2006 | Smith | C23C 14/505 204/192.12 |
| 2013/0209006 | A1* | 8/2013 | Kolev | C23C 16/45546 384/129 |
| 2015/0345015 | A1* | 12/2015 | Chiba | C23C 16/45548 118/728 |

FOREIGN PATENT DOCUMENTS

| | | |
|---|---|---|
| DE | 10337732 | 3/2005 |
| EP | 1676672 | 7/2006 |
| JP | 51-145333 | 12/1976 |
| JP | 2004-055636 | 2/2004 |
| JP | 2016-169401 | 9/2016 |
| JP | 2018-147939 | 9/2018 |
| KR | 10-2011-0096111 | 8/2011 |
| WO | WO 03/076684 | 9/2003 |

OTHER PUBLICATIONS

International Preliminary Report on Patentability Dated Nov. 2, 2021 From the International Bureau of WIPO Rc. Application No. PCT/EP2020/062768. (8 Pages).

Notification of the Results of the Initial Substantive Examination Dated Jul. 18, 2023 From the Kementerian Hukum Dan Hak Asasi Manusia, Republik Indonesia, Direktorat Jenderal Kekayaan Intelektual [Ministry of Law and Human Rights of the Republic of Indonesia, Directorate General of Intellectual Property] Re. Application No. P00202109780 and Its Translation Into English. (5 Pages).

Recherchebericht [Search Report] Dated Dec. 6, 2019 From the Deutsches Patent—und Markenamt [German Patent and Trademark Office] Re. Application No. 102019111777.1 and Its Summary in English. (11 Pages).

Notice of Reasons for Refusal Dated Feb. 6, 2024 From the Japan Patent Office Re. Application No. 2021-566310 and Its Translation Into English. (21 Pages).

\* cited by examiner

MOVABLE WORK PIECE CARRIER DEVICE FOR HOLDING WORK PIECES TO BE TREATED

RELATED APPLICATIONS

This application is a National Phase of PCT Patent Application No. PCT/EP2020/062768 having International filing date of May 7, 2020, which claims the benefit of priority of German Patent Application No. 10 2019 111 777.1 filed on May 7, 2019. The contents of the above applications are all incorporated by reference as if fully set forth herein in their entirety.

FIELD AND BACKGROUND OF THE INVENTION

In the context of the present invention, the term "platform" is used to describe a work piece carrier device. The term "merged platform" is used to describe a work piece carrier device, where the said device is implemented as a system of carousels.

The present invention relates to a merged platform to be used for the treatment of work pieces in an evacuable treatment chamber, especially in coating chambers for physical vapor deposition (PVD), such as the ones used for e.g. cathodic arc or magnetron sputtering processes. The inventive merged platform e.g. allows to perform different pre-treatment, coating and post-treatment steps on a batch of work pieces in one vacuum chamber, by moving the work pieces from one treatment step to another one. This offers a high flexibility regarding the batch sizes to be processed, pre- and post-treatment, and coating steps, and also allows to treat work pieces of various shapes and sizes. The inventive platform is especially suitable for newly developed types of coaters, such as the ones allowing the processing and coating of different amounts of work pieces in the same system, either distributed in smaller or larger workpiece batches.

From the state of the art it is known to use pre- or post-treatment steps, such as heating- and/or cleaning steps, for various vacuum treatment processes, before and/or after vacuum coating. These steps are necessary for example in order to ensure a good adhesion of the deposited coating to the substrate. Pre-treatment steps ensuring good adherence are especially important for wear-resistant hard coatings on tools such as drills, mills, forming tools, and mechanically loaded components such as gears, injection molds, camshafts, as well as for other fast moving and heavily loaded parts enduring high mechanical and abrasive loads during operation. An extraordinarily good adhesion of the coating with the surface of the substrate is therefore a prerequisite for serviceable, economical use. The main aim of these pre-treatment processes is to prepare the workpieces in order to achieve a good adhesion of the subsequent coating to the base. Proven methods of pre-treatment, that increase the adhesion of coatings to the substrate include heating by electron bombardment, as known from DE 3330144, sputter etching with noble gas ions, as described in DE 2833876, and etching the work pieces with reactive chemistry.

In order to attain a distribution of coating thickness and quality which is as uniform as possible, it is crucial to control the movement of the workpieces past treatment sources and etching sources. Parts to be pre-treated, coated and/or post-treated are often fastened to individual work piece holders that are disposed symmetrically around the system axis, or rotatably mounted on a carousel-like work piece support. Known industrial equipment usually uses work piece holders or carousel-like work-piece supports that are connected rotatably with the vacuum chamber, typically with the bottom of the vacuum chamber.

In the previously not published Swiss Patent Application No. 2278/97 and 1736/98 of Sep. 25, 1997 respectively Aug. 25, 1998, a planetary system workpiece holder is described. Therein a first system is provided which can be coupled with an installation-side driving and which is rotatable about an axis with respect to the installation. The first rotational system is denoted in the following as sun system. With respect to the sun system, a second rotational system is provided on the latter, with rotational axis offset parallel with respect to that of the sun system, in the following referred to as planet system, whose motions are generated through the releasable engagement on the reference system formed by the installation of the chamber. On the planetary system a third rotational system is provided, referred to in the following as moon system, which is rotatably supported with rotational axis parallel to planetary system and sun system.

Workpiece supports of this type with threefold rotational motion are applied, in particular, in the case of relatively small workpieces in order to guide them past treatment sources stationary on the installation, such as coating sources, and in order to treat the work pieces uniformly from all sides. In the above described workpiece support configuration, the moon systems are set into rotational motion intermittently. This leads to a partly inconstant, superimposed motion of the workpiece, and thus to negative consequences for the uniformity of the work piece treatment. The intermittent rotation is especially disadvantageous for coating systems made of several thin layers, leading to a decrease of coating quality.

In U.S. Pat. No. 6,620,254/EP 1153155B1 Zaech and Kurz disclose an improvement of the above described work piece support. Thereby the driving connection between sun system and moon system is established such that it is uninterrupted, a continuous moon system rotational motion is realised. The driving connection is preferably realised as a forced driving connection. The sun system is coupled to an apparatus-side drive. At least one planet system supported on the sun system, is rotatable about a planet axle and is provided with a driving coupling with respect to the apparatus. At least one moon system is supported on the planet system, and is rotatable about a moon axle with a driving connection to the sun system. A receiver for at least one work piece is provided on the moon system. This driving connection is established, at least during operation of apparatus, in an uninterrupted manner, between the sun system and the moon system.

In EP2048263B1 Esser and Zaech disclose a work piece carrier device with a simplified setup, offering the possibility to change the gear transmission ratio in an easy way. The main advantage of the disclosed work piece carrier is the easy actuation mechanism and at the same time ability to change the gear transmission ratio. The base frame is rotatable around a main axis and is powered by one electric motor. The actuation is not done by using a central actuator. Instead a torque proof gear wheel is fixed on the pivot mounting, another gearwheel is mounted on the carousels periphery. The two rack-wheels gear into each other. The motor powers the gear wheel on the carousels periphery, and thus the work piece carrier is rotated. The work piece holders are connected to the central axis via rack-wheels in a way, which leads to a forced rotation of the work piece holders. This type of setup leads to a continuous rotation of the work pieces, which is especially important for the deposition of thin multilayer coatings. The gear transmission ratio can be adjusted by changing the size, respectively the number of teeth on the gear wheels.

Another option is to use a vacuum treatment system with a work piece holder, where the work piece holder is a carousel. Systems of said kind often use carousels, which can be fully removed from the vacuum chamber, in order to simplify the loading and unloading of the work piece holder. The removal of such a carousel can be done e.g. using a forklift.

In another approach the carousel is mounted on a base frame with wheels. It can then be transported to the vacuum treatment system and inserted into the chamber by pushing the carousel into the vacuum chamber. A work piece holder of said kind is referred to as a carousel sled. Once the carousel sled is in the final position inside the chamber, the base frame is locked and the central actuation is coupled to the axis of the carousel. A disadvantage of this setup is the complicated coupling mechanism, which is necessary, since the actuation must not be in the way of the carousel sled during inserting of the sled, but at the same time, the coupling mechanism must be connected to the central axis of the carousel, to actuate the carousel. The whole mechanics has to be built in a way, which can withstand the extreme conditions occurring during operation, e.g. it must be capable to run in vacuum conditions.

In EP 2758562B1 Gwehenberger discloses a vacuum treatment system with a work piece holder, where the work piece holder is implemented as a carousel, in a way, which enables to bypass the work pieces, which are to be treated, in front of treatment sources by rotating the carousel around its axis. The work pieces can be mounted on said carousel in a way, which allows single, double or multiple rotation. The carousel is powered by one peripheral actuator. The actuator is located at or close to the side wall of the vacuum chamber opposite to the opening, where the carousel can be inserted. Said actuator is linked to a rack-wheel mounted in the carousels periphery, which gears into another rack-wheel, mounted on the carousels outside. Multiple workpiece holders can be mounted on the carousel, whereas every workpiece holder has a rack-wheel mounted on its outside, in order to allow rotation of the work piece holder. The carousel is preferably realized in the way of a carousel sled, in order to simplify the loading and unloading process. Preferably tracks are mounted inside the vacuum chamber, in order to simplify the inserting process of the carousel sled.

The amount of work pieces to be treated and/or coated using PVD depends on specific costumers needs. The coating chamber, in which the work piece holder is installed, is designed in order to be loaded with a certain number of workpieces of specific sizes and shapes. The work piece batch size as well as the size and shape of the workpieces define the diameter and height of the coating chamber. More specifically, the machines of one equipment family used nowadays, predominantly use a coating chamber which exhibits the same diameter, and is scaled in height, in order to offer equipment with different loading capacities. The work piece holder is then designed in order to fit the needs, especially height and diameter, of the vacuum chamber.

The variety of sizes and shapes of work pieces, as well as the amount of work pieces to be processed and coated is largely dependent on the needs of the costumer. Small coating chambers are used to process and coat small work piece batches.

Large coating chambers have to be provided in order to process and coat large work piece batches. It is currently not economically viable to insert different loadings into one big machine, since the writing-off of the Cost of Goods Sold (COGS) would negatively affect the Total Cost of Ownership (TCO) when loading a big machine with only a small batch. The utilization depend on the number of work pieces. This is the reason that the COGS must be adapted for smaller loading volumes.

The need for various different chamber designs in order to offer equipment with different loading capacities leads to enormous time loss and effort invested into various chamber designs. Besides high expenses due to redesigning of the chamber for every machine of an equipment family, the coating development has to be adapted for every machine, due to different heights, number of targets, and further reasons. The transfer of one specific coating from one machine to another machine with different dimensions is challenging and time consuming. Furthermore the implementation of various equipment products is time-consuming, since various products can not be implemented all at the same time. This again leads to increased costs. This leads to increased development costs.

SUMMARY OF THE INVENTION

The present invention aims to provide a platform, to be used for the treatment of workpieces in a vacuum system, which allows the vacuum chamber of said vacuum system to be loaded with different workpiece batch sizes, thereby overcoming the problems currently occurring with state of the art vacuum systems. The present invention especially aims to provide a solution overcoming the problems of the state of the art for PVD coating machines. The main aim is to decrease the COGS, in order to attain a lower depreciation rate of the TCO of said vacuum system, while offering a high flexibility considering different treatment methods for workpieces.

These aims are achieved by the present invention, in that a merged platform is mounted in an evacuable treatment chamber of a vacuum system, which can be used for various treatments on different work piece batch sizes, while working in an economically viable way. Said merged platform consists of at least two carousels with different diameters, with the at least one carousel exhibiting a smaller diameter rotatably mounted on the one carousel exhibiting a larger diameter. Instead of mounting only one carousel exhibiting a smaller diameter, also several carousels of this kind can be mounted on the one carousel exhibiting a larger diameter.

The design of the inventive merged platform offers a wide range of applications, such as a high flexibility considering the work piece length and loading capacity, as well as the opportunity to apply various pretreatments, coatings, and post-treatments to work pieces, all in the same chamber. Among other advantages, this leads to pre-treatment and cooling down time savings. Thereby said platform allows to positively affect the TCO compared to state of the art systems, leading to a decrease in production expenses. Furthermore it offers a higher flexibility regarding the amount of substrates which are to be coated in a chamber of said machine, among many other advantages compared to state of the art solutions.

In a first aspect of the present invention disclosed is a work piece carrier device for holding treatable work pieces to be installed in a vacuum chamber of a vacuum treatment system, comprising one carousel (X) with a diameter ($d_X$), one or multiple carousels ($Y_m$) with a diameter ($d_{Y_m} < d_X$), which are mountable on carousel (X), one or multiple work piece supports (Zn) with diameters ($d_{Z_n} \leq d_{Y_m}$), which are mountable on the one or multiple carousels ($Y_m$), a first actuator (A1) and a second actuator (A2), wherein the forced connections between the actuators (A1), (A2) and carousel (X) and ($Y_m$) are installed using gearing mechanisms in a way, which enables at least two operating modes of the system, whereas in Mode 1, actuator (A1) is powered and actuator (A2) is not powered, leading to a rotation of carousel (X) around its central rotation axis ($R_x$), and in Mode 2, actuator (A1) is not powered and actuator (A2) is powered, leading to a rotation of carousels ($Y_m$) around their central rotation axis ($R_{Ym}$), while carousel (X) stays in place. It is understood hereby that the workpiece carrier device according to the invention is not limited to the use under vacuum conditions and can also be used in coating systems under atmospheric pressure or overpressure, or the like.

In another example of the first aspect, the carousel (X) of the work piece carrier device according to the invention is substantially circle-shaped, so that the area of the surface carousel (X) is defined by $A_X = \pi \cdot (d_X/2)^2$. A substantially circle-shaped design of the carousel (X) hereby promises, in particular, an exact positioning with respect to treatment devices arranged on the outside of the carousel (X). The one or multiple carousels ($Y_m$) and/or the one or multiple work piece supports ($Z_n$) may in the context of a flexible manufacturing process, on the other hand, preferably also be triangular, or square, for example rectangular, quadratic, trapezoidal, or even pentagonal, hexagonal, partially or completely oval or the like. With regard to the area of the carousel (X), the carousel ($Y_n$) and $Z_n$ the preferred option is that $A_z \leq A_y < A_x$.

In another example of the first aspect, the central carousel (X) and the at least one carousel ($Y_m$) of the work piece carrier device according to the invention are connected via a third gearing mechanism in such a manner that, when the work piece carrier device is operated in Mode 1, the at least one carousel ($Y_m$) is set in rotation motion via the third gearing mechanism. Such a design allows in particular an even more flexible processing of individual workpieces.

In another example of the first aspect, the first actuator (A1) of the work piece carrier device according to the invention is connected to the central carousel (X) via a first gearing mechanism and the second actuator (A2) is connected to the at least one peripherical carousel ($Y_m$) via a second gearing mechanism. Such a design allows, in particular, an exactly controllable machining of individual workpieces.

In another example of the first aspect, the first actuator (A1) and/or the second actuator (A2) of the work piece carrier device according to the invention are designed as electromechanical actuators, wherein a rotary movement is preferably generated around the axes ($R_x$) and/or ($R_{Ym}$) by applying a control voltage to the actuators (A1) and/or (A2). In contrast to, for example, magnetically controlled systems, the use of mechanical or electromechanical actuators makes it possible to minimize the design effort required to enable targeted control with respect to the positioning of the work pieces in the work piece carrier device.

In another example of the first aspect, the work piece carrier device according to the invention can be used at pressure conditions below 1 mbar, preferably below 0.1 mbar, in particular below 0.001 mbar. Such a design allows in particular the use in vacuum applications for PVD coating processes, or the like.

In order to ensure a precise and easily controllable coating of substrates arranged within the work piece carrier device, the invention provides in another example of the first aspect, that the carousel (X) and/or the one or multiple carousels ($Y_m$) and/or the one or multiple work piece supports ($Z_n$) are substantially planar-shaped. Within the scope of the invention, a planar surface is understood to mean in particular surfaces with deviations from the mean outer surface of less than 5%, preferably less than 2%, particularly preferably less than 1% of the total thickness of the corresponding carousels.

Within the scope of an arrangement that is space-saving and compact, the invention further provides in another example of the first aspect, that one or multiple carousels ($Y_m$) are arranged completely within the area of the first carousel (X) and/or the one or multiple work piece supports ($Z_n$) are arranged completely within the area of the one or multiple carousels ($Y_m$), wherein the carousels ($Y_m$) are mounted preferably at the periphery of carousel (X), such that the edges of the carousel ($Y_m$) and (X) are overlapping, when looked at it from above. It is understood that an arrangement within the area of the corresponding carousel preferably also means an arrangement in an extended area, for example at a distance from the surface of the corresponding carousel with respect to the direction of the corresponding rotation axis (not perpendicular to the direction of the corresponding rotation axis).

Within the scope of an arrangement that is space-saving and compact, in another example of the first aspect the invention further provides that the first (A1) and/or second actuator (A2) is arranged below the carousel (X), opposite to the arrangement area for the workpieces. Within the scope of such an arrangement, the actuators may, for example, be arranged at the bottom of a vacuum chamber into which a work piece carrier device of the invention can be inserted.

In order to ensure a precise and easily controllable coating of substrates arranged within work piece carrier device, in another example of the first aspect, the invention provides in particular that the axes of rotation ($R_x$) and ($R_{Ym}$) are aligned parallel to each other.

In order to ensure a precise and easily controllable coating of substrates arranged within the work piece carrier device, in another example of the first aspect, the invention provides in particular that the carousels (X), ($Y_m$) and ($Z_n$) being aligned parallel to one another, preferably simultaneously aligned perpendicular to the axes of rotation ($R_x$) and ($R_{Ym}$).

In another example of the first aspect, which in particular enables a particularly flexible positioning of the workpieces, the carousel (X) and the one or multiple carousels ($Y_m$) can be rotated around its rotation axis ($R_X$, $R_{Ym}$) either in clockwise or anti-clockwise direction, wherein the rotation angle ($\varphi_1$, $\varphi_m$) can be set to arbitrary values.

With regard to a compact and space-saving arrangement, which at the same time offers sufficient space for the arrangement of workpieces to be treated, in another example of the first aspect, the one or multiple carousels ($Y_m$), exhibiting a diameter $d_{Ym}$, preferably 10% $d_X \leq d_{Ym} \leq 50\%$ $d_X$, most preferably $d_{Ym} = 50\%$ $d_X$ and/or the diameter of the work piece supports ($Z_n$) is between 10% $d_{Ym} \leq d_{Zn} \leq 50\%$ $d_{Ym}$.

In another example of the first aspect, the carousel (X) is built in the way of a carousel sled, wherein the carousel (X) is mounted on a base frame with wheels. Such a design allows in particular an easy transport of the work piece carrier device as well as an easy introduction into a vacuum treatment system in which it can be inserted by pushing the carousel into the vacuum chamber.

In another example of the first aspect, which allows a reliable spatial separation of individual workpieces, walls are arranged next to the one or between the multiple carousels ($Y_m$), wherein the walls are mounted in a vertical manner next to the carousel ($Y_m$) or between the carousels ($Y_m$), preferably at approximately right angles on top of carousel X, wherein the walls exhibit a height and width, which is in particular sufficient to completely separate each section in which one carousel ($Y_m$) is mounted from the neighboring sections.

In a second aspect of the present invention it is disclosed a surface treatment system for treating workpieces, comprising a previously described work piece carrier device for carrying work pieces during treatment, a chamber, particularly in the form of a vacuum chamber, for the introduction of the work piece carrier device, at least one treating device for treating the work pieces arranged within the work piece carrier device. Thus, the surface treatment system according to the invention has the same advantages as already described in detail with regard to the work piece carrier device according to the invention.

Within the context of a structurally simple and reliable fixation of work piece carrier device, in another example of the second aspect, the work piece carrier device of the surface treatment system is arranged at the wall or the bottom of the chamber, preferably connected to the chamber by the actuators (A1) and (A2), which are removably fixed to the wall or the bottom of the chamber. A removable fixation can be achieved, for example, via magnetic holders or screw or plug connections, or the like.

In order to guarantee a uniform and high quality treatment of work pieces, in another example of the second aspect, the work piece carrier device of the surface treatment system is arranged in the center of the chamber of the treatment system, wherein one or more treatment devices for treating the workpieces are arranged around the work piece carrier device. The treatment device or the plurality of treatment devices are preferably fixed to the wall of the chamber and are advantageously arranged symmetrically around the work piece carrier device, which is arranged centrally in the surface treatment system according to the invention.

| Description of figures | |
|---|---|
| FIG. 1 | Schematic illustration of m = 8 carousels ($Y_m$) mounted decentralized on a carousel (X). The work piece supports are not shown in this figure. |
| FIG. 2 | Schematic illustration of m = 1 carousel ($Y_m$) mounted decentralized on a carousel (X). The carousel ($Y_m$) is equipped with n = 4 work piece holders ($Z_n$) |
| FIG. 3 | Schematic illustration of a vertical cut through the merged platform in one embodiment |
| FIG. 4 | Schematic illustration of a vertical cut through the merged platform and operating mode referred to as "Carousel Mode" Actuator A1 is ON (turning), Actuator A2 is OFF (on hold) |
| FIG. 5 | Schematic illustration of a vertical cut through the merged platform and operating mode referred to as "Spindle Mode" Actuator A1 is OFF (on hold), Actuator A2 is ON (turning) |
| FIG. 6 | Schematic illustration of one embodiment of the present invention where ($Y_m$) is placed in front of a pre-treatment module $T_k$. |
| FIG. 7 | Schematic illustration of one embodiment of the present invention, where carousel (X) is rotated around an angle $\varphi_1 = 45°$ in clockwise direction. Thereby carousel ($Y_m$) is moved to treatment module $T_{k+1}$. |
| FIG. 8 | Schematic illustration of one embodiment of the present invention, where carousel (X) is rotated around an angle $\varphi_1 = 90°$ in anti-clockwise direction. Thereby carousel ($Y_m$) is moved to treatment module $T_{k-1}$. |
| FIG. 9 | Schematic illustration of one embodiment where m = 3 carousels ($Y_m$) are mounted decentralised on a carousel (X) and separated by vertical walls. In this illustration n = 4 work piece supports ($Z_n$) are mounted on the carousel ($Y_1$), ($Y_2$), ($Y_3$). |

| Description of figures | |
|---|---|
| | The carousel ($Y_m$) is moved about $\varphi_1 = 120°$ in anti-clockwise direction and positioned in front of treatment source $T_k$. |
| FIG. 10 | Schematic illustration of n = 8 work piece supports mounted directly on carousel (X). |

DESCRIPTION OF SPECIFIC EMBODIMENTS OF THE INVENTION

The present invention discloses a merged platform offering a high flexibility regarding the loading capacities, but also the treatment methods, thereby leading to a decrease of TCO. Said merged platform contains a carousel (X) with a diameter $d_X$=100%, which is powered by an actuator (A1), and can be rotated to either side, either clockwise or anti-clockwise. The rotation angle ($\varphi_1$) can be set to arbitrary values. Either one or multiple carousels ($Y_m$) exhibiting a diameter $d_{Ym}<d_X$ are mounted on carousel (X). The number of carousels ($Y_m$) mounted on carousel (X) will be referred to as m. The one or multiple carousels ($Y_m$) can be rotated around its m rotation axis ($R_{Ym}$) either in clockwise or anti-clockwise direction. The rotation of the carousels ($Y_m$) is generated by linking the carousels ($Y_m$n) to one self-contained actuator (A2) by using a forced connection. Each of the carousels ($Y_m$) can be equipped with a number n of work piece supports $Z_n$. The work piece supports are rotatably mounted on the carousels ($Y_m$), and can be rotated around their rotation axis ($R_{Zp}$), with 1≤p≤n. The work piece supports ($Z_n$) exhibit a diameter $d_{Zn}≤d_{Ym}$. The work piece supports are forced to rotate using a forced connection.

An embodiment of the invention will be described by way of example, which is meant to be merely illustrative and therefore non limiting.

The figures, which are referred to in the text, are not true-to-scale drawings, and therefore non-limiting. E.g. the size or number of the carousels could also be chosen to be different.

Figure 1:
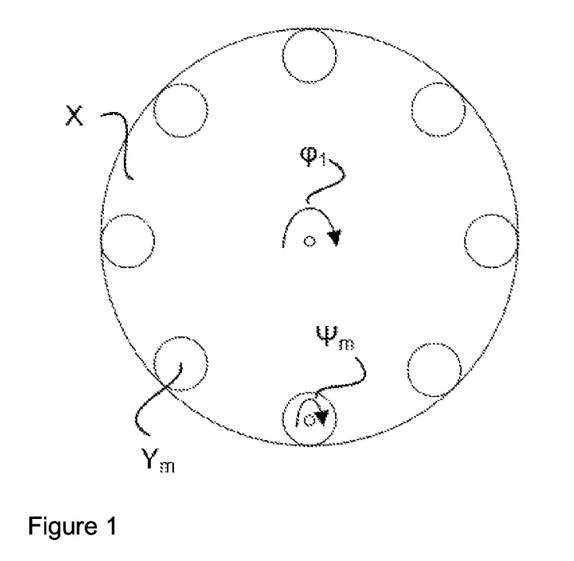

According to one aspect of the present invention, which is shown in FIG. 1, the m carousels ($Y_m$) are mounted decentralized on the one carousel (X). In the example shown in FIG. 1, m is chosen to be m=8, but could also be chosen to be a different number. The carousel (X) can be rotated around a rotation angle ($\varphi_1$). The carousels ($Y_m$) can be rotated around their m rotation angles ($\psi_m$).

According to a preferred embodiment of the present invention, the carousels ($Y_m$) are mounted at the periphery of carousel (X), such that the edges of the carousel ($Y_m$) and (X) are overlapping, when looked at it from above. Examples of this preferred embodiment are shown in FIGS. 6-9.

Figure 2:
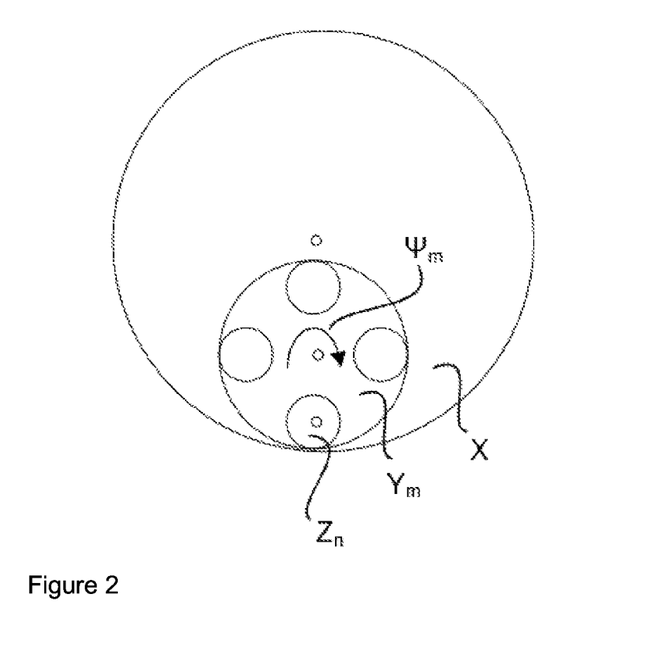
Figure 3:
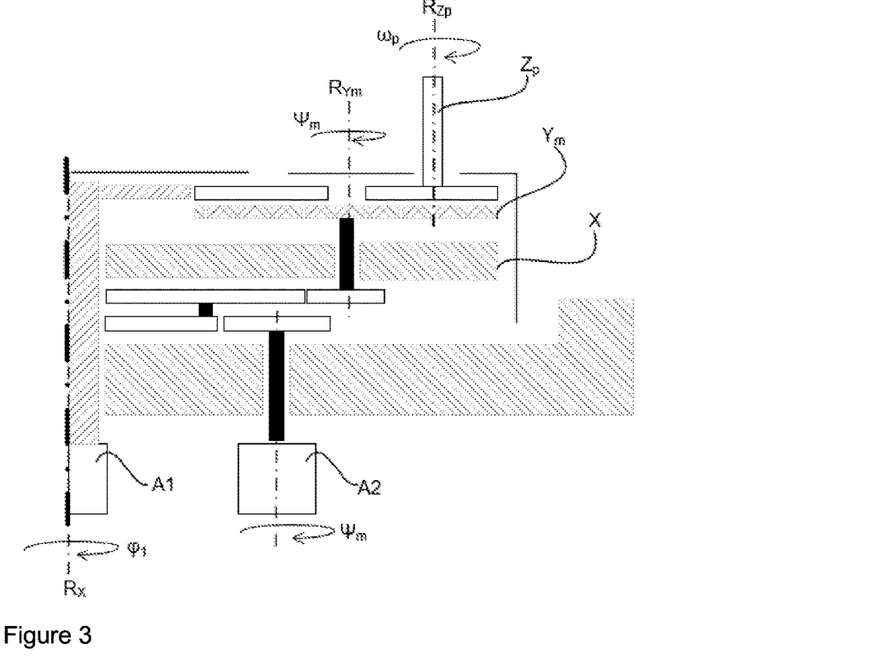

According to one embodiment of the present invention, shown in FIG. 2, m=1 carousel ($Y_m$), exhibiting a diameter $d_{Ym}$, preferably 10% $d_X≤d_{Ym}≤50%$ $d_X$, most preferably $d_{Ym}$=50% $d_X$, is rotatably mounted on carousel (X). A vertical cut through the setup of the merged platform in this embodiment is shown in FIG. 3. Carousel (X) is powered by a centralized actuator (A1), which is linked to the carousel (X) via an approximately vertical axle, functioning as a rotation axis ($R_X$). Carousel (X) can be rotated clockwise and anti-clockwise, whereas the rotation angle ($\varphi_1$) can be set to arbitrary values. Carousel ($Y_m$) is mounted decentralized on Carousel (X), and is powered by a second, self-contained actuator (A2). Carousel ($Y_m$) is rotatable around its rotation axis ($R_{Ym}$) about an angle ($\psi_m$). Actuator (A2) powers a system of gears, which form a forced connection. Since carousel ($Y_m$) is mounted rotatably on carousel (X) via an approximately vertical axis, functioning as rotation axis ($R_{Ym}$), a second rotation movement can be exhibited. The actuator (A2) allows the carousel ($Y_m$) to be rotated clockwise and anti-clockwise, whereas the rotation angle ($\psi_m$) can be set to arbitrary values. The combination of two self-contained actuators leads to different operating modes. The carousel ($Y_m$) is equipped with n=4 work piece supports ($Z_n$). The diameter of the work piece supports ($Z_n$) is chosen to be between 10% $d_{Ym} \leq d_{Zn} \leq 50\%$ $d_{Ym}$. In this embodiment the diameter $d_{Zp}$ is the same for all n the work piece supports ($Z_n$), with 1≤p≤n. The rotation of the n work piece supports ($Z_n$) is achieved by putting carousel (X) an hold, say the actuator (A1) is stopped. Each of the work piece supports rotatable around a rotation axis ($R_{Zn}$) in clockwise or anti-clockwise direction, whereas the rotation angle is denoted as ($\omega_p$).

The number n of work piece supports which are mounted on the carousels ($Y_m$) can vary with varying m. The carousels ($Y_m$) are preferably equipped with a number n of work piece supports ($Z_n$), where 1≤n≤10.

Figure 4:
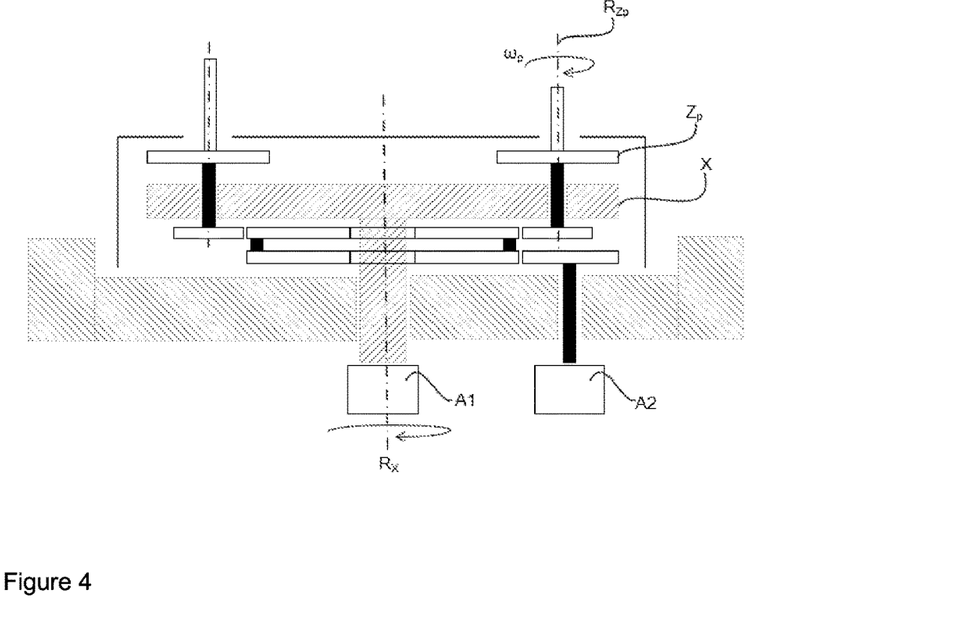

The inventive platform can be operated in two different modes. The first mode is shown in FIG. 4 and in this text referred to as "Carousel Mode". In this operating mode the actuator (A1) is powered, and thus turned around either clockwise or anti-clockwise. The actuator (A2) is fixed, and not powered. The carousel plate of carousel (X) is thus rotated in either clockwise or anti-clockwise direction around its rotation axis ($R_x$). This leads to a forced rotation of the gear spindle and thus the carousel plate of carousel ($Y_m$), more exactly the spindles ($Z_p$), where the substrates are mounted, around ($R_{Zp}$).

Figure 5:
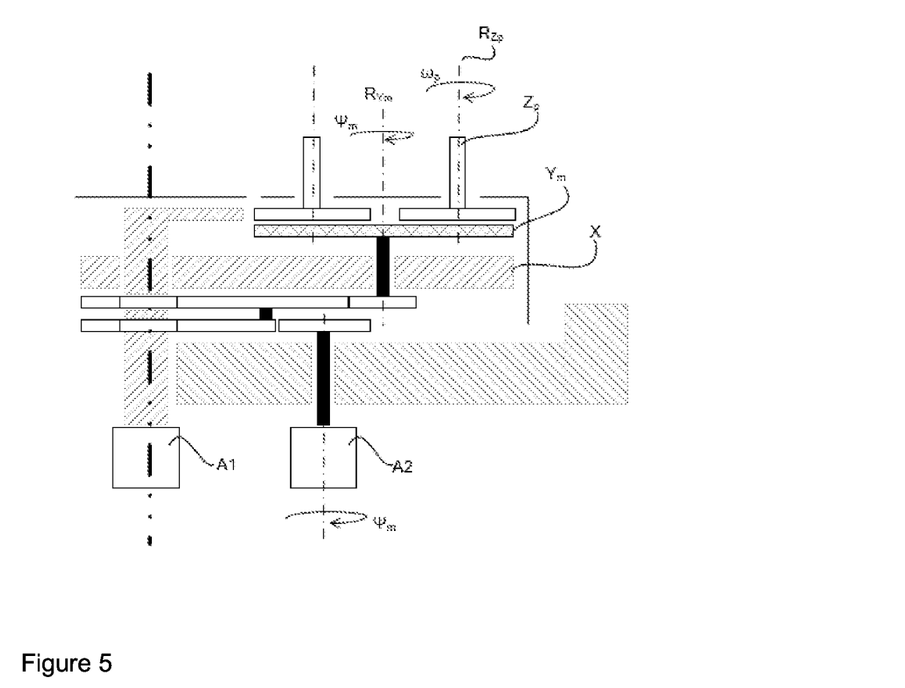
Figure 6:
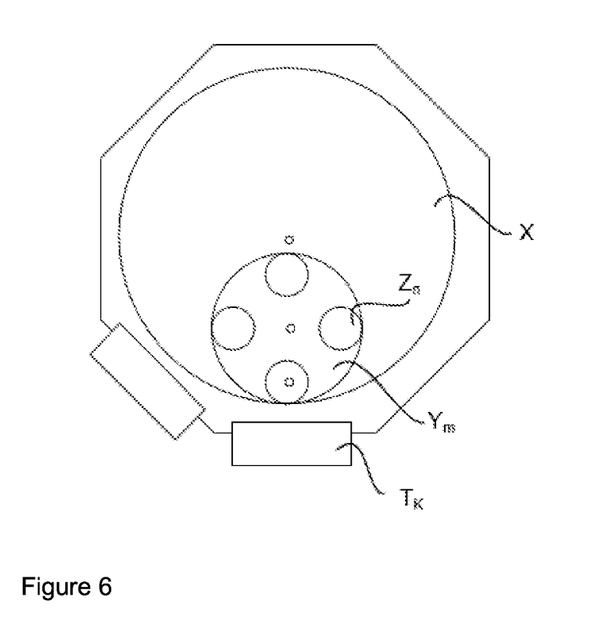

The second mode is shown in FIG. 5 and in this text referred to as "Spindle Mode". In this operating mode the actuator (A1) is not powered and thus stays in the same location. This means that the carousel plate of carousel (X) is also fixed and shows no rotation around rotation axis ($R_x$). The rotation angle ($\varphi_1$) is set to a fixed value and remains unchanged during this operating mode. The actuator (A2) is powered and leads to a rotation of the carousel plate of carousel ($Y_m$) around rotation axis ($R_{Ym}$), either in clockwise or in anti-clockwise direction, meaning the rotation angle ($\psi_m$) changes depending on time. The gears, gear strator, gear spindle, and the spindles ($Z_p$), where the substrates are mounted, are thus rotated around a rotation axis $R_{Zp}$ and a rotation angle ($\omega_p$).

The variant using just one carousel ($Y_1$) is however not limiting, it is also possible to mount m carousels ($Y_m$) to carousel X, whereas m≠1, in the same way as described for the variant with just one carousel ($Y_1$). The amount of carousels $Y_m$ mounted to carousel X is preferably chosen to be between 1≤m≤3.

The number n of work piece supports which are mounted on the carousels ($Y_m$) can vary with varying m. According to one embodiment of the present invention, the carousels ($Y_m$) are equipped with a number n of work piece supports ($Z_n$), where 1≤n≤10.

According to a preferred embodiment the carousels ($Y_m$) all exhibit the same diameter $d_{Ym}$, meaning $d_{Yi}=d_{Yj}$ for 1≤i,j≤m. However, according to another aspect of the present invention, the diameters of the carousels ($Y_m$) can also differ from each other, say $d_{Yi} \neq d_{Yj}$ for 1≤i,j≤m.

Figure 7:
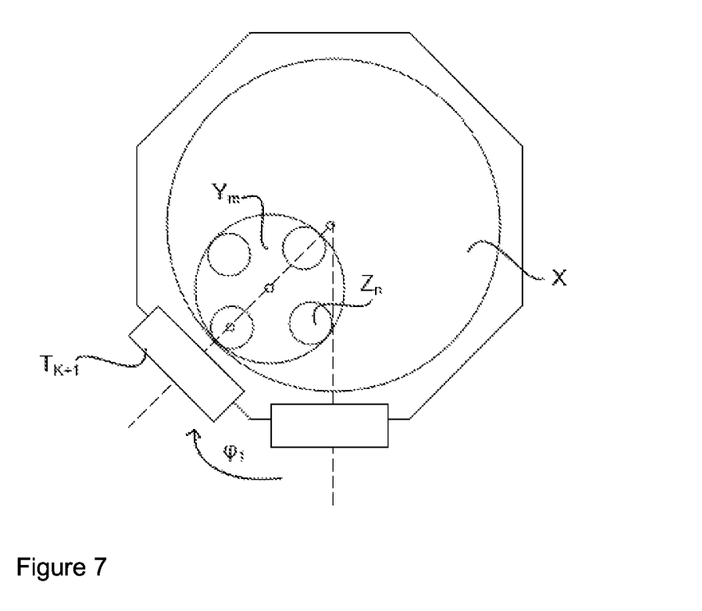
Figure 8:
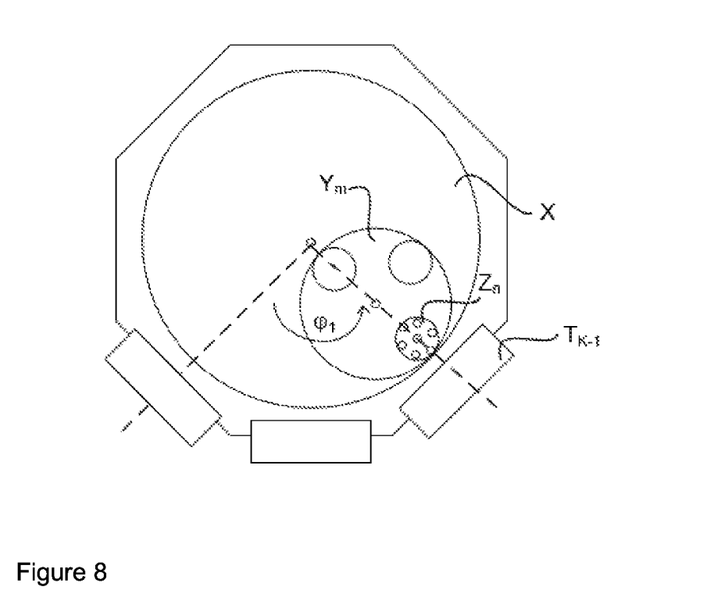

Considering the embodiment, in which m=1 carousel ($Y_m$) is mounted on carousel (X), and n=4 work piece holders ($Z_n$) are mounted on ($Y_m$), the described platform can e.g. be used in order to perform different treatments (pre- and post-treatments) and apply different coating layers to a substrate. According to one embodiment, shown in FIG. 6, the carousel ($Y_m$) can e.g. be placed in front of a module $T_k$ to pre-treat the substrate (such as e.g. heating, etching) in the first place, then it can be moved around an angle ($\varphi_1$). As can be seen in FIG. 7 the carousel (X) is rotated around rotation axis ($R_x$) and about an angle $\varphi_1$=45° in clockwise direction, to another module $T_{k+1}$, e.g. in order to apply a first coating layer. Then it can be moved further, e.g. about $\varphi_1$=90° in anti-clockwise direction, as shown in FIG. 8, in order to treat the substrates in front of treatment source $T_{k-1}$, e.g. to deposit a second coating layer. This is possible since carousel ($Y_m$) is autonomously rotatably mounted on carousel (X). Therefore the substrates on carousel ($Y_m$) can be placed in front of one module until one of the process steps is completed. The carousel ($Y_m$) can then be rotated with a constant angular velocity around ($\psi_m$), in order to achieve a uniform treatment or coating of all substrates. After a process step, carousel ($Y_m$) can be moved to another module, and thus process step, by rotating carousel (X) around a certain angle ($\varphi_1$).

According to one aspect of the present invention the self-contained actuators are mounted decentralized. They can e.g. be mounted in a wall of the vacuum chamber, such as in or neighboring the wall opposite the opening, through which the workpieces are inserted into the chamber. Each actuator is then linked to a rack-wheel mounted in the carousels periphery, which gears into another rack-wheel mounted on the merged platform.

According to one aspect of the present invention, the carousel is built in the way of a carousel sled. Therefore the carousel is mounted on a base frame with wheels. It can then be transported to the vacuum treatment system and inserted into the chamber by pushing the carousel into the vacuum chamber.

According to another aspect of the present invention, the inventive platform is used to coat planar substrates with a coating of varying thickness regarding one dimension. This can be done, e.g. using only m=1 carousel ($Y_m$). Therefore carousel ($Y_1$) is stopped in front of a coating source, and thus ($\varphi_1$) is kept fixed. Carousel ($Y_1$) is luffed in front of a coating source, e.g. an arc or sputter target. Say ($\psi_1$) is changed depending on time, in a controlled manner. Using this method, convex coatings can be applied. Furthermore dye distributions can be generated using this method, e.g. for decorative applications.

According to one aspect of the invention, the inventive merged platform is inserted into a vacuum chamber exhibiting a large height in order to coat wide-stretched, rod-shaped work pieces, which could not be treated in a vacuum chamber of smaller height.

Figure 9:
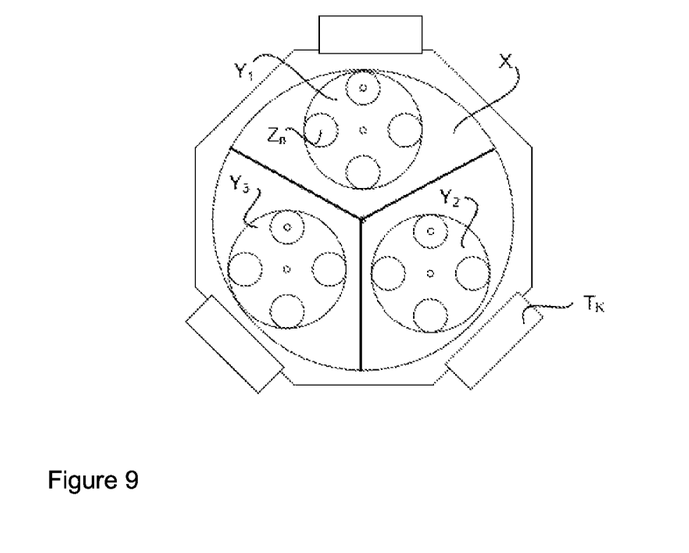

According to one embodiment of the present invention, which is shown in FIG. 9, m=3 carousels $Y_m$ are mounted decentralized on a carousel X. Three walls are mounted in a vertical manner between the m carousels Yi, with 1≤i≤m, and at approximately right angles on top of carousel X. These walls exhibit a height and width, which is sufficient to completely separate each section in which one carousel $Y_i$ is mounted from the neighboring sections. Said merged platform is mounted in a vacuum chamber with a number k of treatment sources $T_k$, which is chosen in order to allow different treatments on the substrates, which are mounted on different carousels $Y_i$. The number of treatment sources can e.g. be chosen to be k=3. This allows to insert three different substrate batches, which can be treated in different ways and orders, since they are shielded from the treatment, which is applied to the neighboring section and thus batch of substrates. According to one aspect of the present invention the etching procedure applied to the substrate batch on carousel $Y_1$ differs from the etching procedure applied to the substrate batch on carousel $Y_2$ and $Y_1$ by varying the treatment time, although the substrates are treated using the same treatment source $T_k$.

Figure 10:
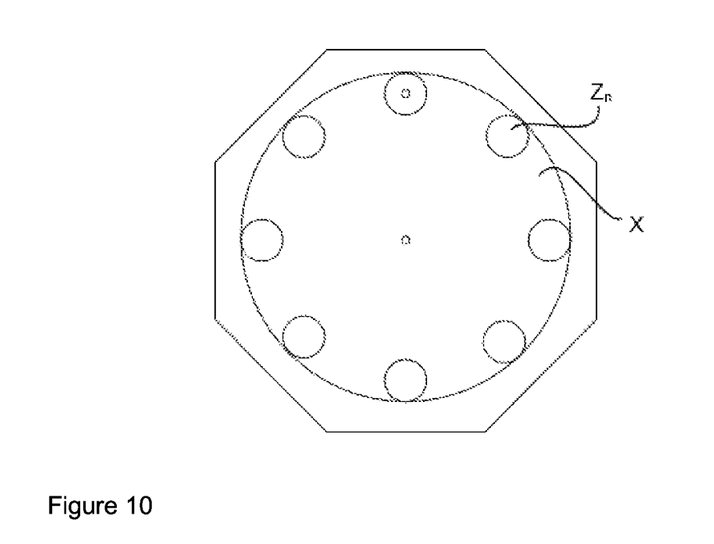

According to one embodiment, which is shown in FIG. 10, a machine with a coating chamber exhibiting a coating height of h=400 mm is equipped with an inventive merged platform. Said merged platform comprises a carousel (X) upon which m further carousels ($Y_m$), e.g. m=8 are mounted. If the platform is operated in the "Carousel Mode", n work piece supports ($Z_p$), with 1≤p≤n, are mounted on the carousel ($Y_m$) in such a way, that n≤m, preferably n=m, so in this example n=8. The rotation axis ($R_{Zm}$) und ($R_{Zp}$) are overlapping. Thereby the work piece supports are mounted on the axles where the carousels ($Y_i$) are mounted, if the carousel is operated in the "Spindle Mode". In the embodiment shown in FIG. 10, $d_{Ym}=d_{Zn}$ holds. The carousel (X) exhibits a diameter of $d_X$=1000 mm. The work piece supports ($Z_n$) are located at the outer edge of carousel (X). Using this configuration the loading capacity of the described machine in this embodiment is 100%. If operated in the said "Carousel Mode" the vacuum chamber is equipped with four treatment sources. The same machine, with a height of h=400 mm, can be equipped with an inventive merged platform, whereas carousel (X) is the same carousel with diameter $d_X$=1000 mm. In contrast to the case with a loading capacity of 100%, m=1 carousel ($Y_m$) is mounted on the carousel (X). On this carousel ($Y_1$), n=4 work piece supports $Z_n$ are mounted. This leads to a loading capacity of 50%. The number of treatment sources is changed accordingly to two treatment sources used for a loading capacity of 50%. Comparing the two situations, the recipient remains the same and the carousel (X) also remains unchanged. The number m of carousels ($Y_m$), the number n of work piece supports ($Z_n$), and the number k of targets $T_k$ is changed according to the loading capacity. The carousels ($Y_m$) keep the required distance between target and substrates and turn around the rotation axis ($R_{Ym}$), with a constant angular velocity. The gear transmission ratio is adapted to the coating, which is applied. Carousel (X) can be rotated about a certain angle ($\varphi_1$), in order to move carousel ($Y_i$) with 0≤i≤m from one position (one process step) to the next position (second process step), and move another carousel ($Y_j$) with 0≤j≤m, j≠l, into the position previously occupied by carousel ($Y_i$).

LABELLING OF FIGURES

| | |
|---|---|
| A1 | Actuator 1 |
| A2 | Actuator 2 |
| $d_X$ | Diameter of carousel X |
| $d_{Ym}$ | Diameter of Carousel $Y_m$ |
| $d_{Zp}$ | Diameter of Work piece support $Z_p$ |
| $R_X$ | Rotation axis of carousel X |
| $R_{Ym}$ | Rotation axis of carousel $Y_m$ |
| $R_{Zp}$ | Rotation axis of work piece holder $Z_p$ |
| $T_k$ | Treatment source |
| X | Carousel |
| $Y_m$ | Carousel |
| $Y_1, Y_2, Y_3$ | Carousel |
| $Z_p$ | Work piece support |
| $\varphi_1$ | Rotation angle of carousel X around its central axis |
| $\psi_m$ | Rotation angle of carousel $Y_m$ around its central axis |
| $\omega_p$ | Rotation angle of work piece support $Z_p$ |

The invention claimed is:

1. A work piece carrier device for holding treatable work pieces to be installed in a vacuum chamber of a vacuum treatment system, comprising:
   one carousel X with a diameter $d_X$,
   one or multiple carousels $Y_m$ with a diameter $d_{Ym}<d_X$, which are mountable on the carousel X
   one or multiple work piece supports $Z_n$ with diameters $d_{Zn} \le d_{Ym}$, which are mountable on the one or multiple carousels $Y_m$,
   a first actuator and a second actuator,
   wherein forced connections between the first actuator and the second actuator, and the carousel X and $Y_m$ are installed using gearing mechanisms in a way, which enables at least two operating modes of the system, whereas in
   Mode 1, the first actuator is powered and the second actuator is not powered, leading to a rotation of the carousel X around its central rotation axis $R_X$, and in
   Mode 2, the first actuator is not powered and the second actuator is powered, leading to a rotation of the one or multiple carousels $Y_m$ around their central rotation axis $R_{Ym}$, while the carousel X stays in place,
   wherein the one or multiple carousels $Y_m$ are arranged completely within the area of the carousel X and/or the one or multiple work piece supports $Z_n$ are arranged completely within the area of the one or multiple carousels $Y_m$,
   wherein the one or multiple carousels $Y_m$ are mounted at a periphery of the carousel X, such that the edges of the one or multiple carousel $Y_m$ and X are overlapping.

2. The work piece carrier device according to claim 1, wherein the carousel X is substantially circle-shaped, so that the area of the surface of the carousel X is defined by $A_X=\pi(d_X/2)^2$.

3. The work piece carrier device according to claim 1, wherein, the carousel X and the one or multiple carousels $Y_m$ are connected via a third gearing mechanism in such a manner that, when the work piece carrier device is operated in Mode 1, the one or multiple carousels $Y_m$ are set in rotation motion via the third gearing mechanism.

4. The work piece carrier device according to claim 1, wherein the first actuator is connected to the carousel X via a first gearing mechanism and the second actuator is connected to the one or multiple carousels $Y_m$ via a second gearing mechanism.

5. The work piece carrier device according to claim 1, wherein at least the first actuator or the second actuator are designed as electromechanical actuators.

6. The work piece carrier device according to claim 1, wherein the device can be used at pressure conditions below 1 mbar.

7. The work piece carrier device according to claim 1, wherein at least the carousel X or the one or multiple carousels $Y_m$ or the one or multiple work piece supports $Z_n$ are substantially planar-shaped.

8. The work piece carrier device according to claim 1, wherein at least the first or second actuator is arranged below the carousel X, opposite to the arrangement area for the work pieces.

9. The work piece carrier device according to claim 1, wherein the axes of rotation $R_x$ and $R_{Y_m}$ are aligned parallel to each other.

10. The work piece carrier device according to claim 1, wherein the carousel X, the one or multiple carousels Ym and the one or more multiple work piece supports $Z_n$ being aligned parallel to one another.

11. The work piece carrier device according to claim 1, wherein the carousel X and the one or multiple carousels $Y_m$ can be rotated around its rotation axis $R_X$, $R_{Ym}$ either in clockwise or anti-clockwise direction, wherein a rotation angle can be set to arbitrary values.

12. The work piece carrier device according to claim 1, wherein the one or multiple carousels $Y_m$ exhibiting at least a diameter $d_{Ym}$ or the diameter of the work piece supports is between 10% $d_{Ym} \leq d_{Zn} \leq 50\%$ $d_{Ym}$.

13. The work piece carrier device according to claim 1, wherein the carousel X is built in the way of a carousel sled, wherein the carousel X is mounted on a base frame with wheels.

14. The work piece carrier device according to claim 1, wherein walls are arranged next to the one or between the multiple carousels $Y_m$, wherein the walls are mounted in a vertical manner next to the one or between the multiple carousels $Y_m$ which is in particular sufficient to completely separate each section in which one of the one or multiple carousels $Y_m$ is mounted from the neighboring sections.

15. The work piece carrier device according to claim 5, wherein a rotary movement is generated at least around the axes $R_x$ or $R_{Ym}$ by applying a control voltage to one of the actuator.

16. The work piece carrier device according to claim 9, wherein the one or multiple second carousels being simultaneously aligned perpendicular to the axes of rotation $R_X$ and $R_{Ym}$.

17. The work piece carrier device according to claim 11, wherein the one or multiple carousels exhibit exhibiting a diameter 10% $d_X \leq dYm \leq 50\%$ $d_X$.

18. A surface treatment system for treating workpieces, comprising:
a work piece carrier device for carrying work pieces during treatment to be installed in a vacuum chamber of a vacuum treatment system, comprising:
a first carousel with a diameter,
one or multiple second carousels with a diameter, which are mountable on the first carousel
one or multiple work piece supports $Z_n$ with diameters, which are mountable on the one or multiple second carousels,
a first actuator and a second actuator,
wherein forced connections between the actuators, and first carousel and are installed using gearing mechanisms in a way, which enables at least two operating modes of the system, whereas in
Mode 1, the first actuator is powered and the second actuator is not powered, leading to a rotation of the first carousel around its central rotation axis, and in
Mode 2, the first actuator is not powered and the second actuator is powered, leading to a rotation of one or multiple second carousels around their central rotation axis, while the first carousel stays in place, wherein the one or multiple second carousels are arranged completely within the area of the first carousel and/or the one or multiple work piece supports $Z_n$ are arranged completely within the area of the one or multiple second carousels, wherein the one or multiple second carousels are mounted at a periphery of first carousel, such that the edges of the one or multiple second carousel and the first carousel are overlapping,
a chamber for the introduction of said work piece carrier device,
at least one treating device for treating the work pieces which can be arranged within the work piece carrier device.

* * * * *

UNITED STATES PATENT AND TRADEMARK OFFICE
CERTIFICATE OF CORRECTION

PATENT NO. : 12,024,769 B2
APPLICATION NO. : 17/609470
DATED : July 2, 2024
INVENTOR(S) : Jürgen Gwehenberger et al.

It is certified that error appears in the above-identified patent and that said Letters Patent is hereby corrected as shown below:

On the Title Page

In item (72) Inventors, Line 2:
"Feldkirch (CH)" should be changed to -- Feldkirch (AT) --

Signed and Sealed this
Third Day of December, 2024

Katherine Kelly Vidal
*Director of the United States Patent and Trademark Office*